(12) United States Patent
Chang et al.

(10) Patent No.: US 8,530,875 B1
(45) Date of Patent: Sep. 10, 2013

(54) PHASE CHANGE MEMORY INCLUDING OVONIC THRESHOLD SWITCH WITH LAYERED ELECTRODE AND METHODS FOR FORMING SAME

(75) Inventors: Kuo-Wei Chang, Cupertino, CA (US); Jinwook Lee, San Jose, CA (US); Jong-Won Lee, San Francisco, CA (US); Elijah V. Karpov, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 12/774,772

(22) Filed: May 6, 2010

(51) Int. Cl.
*H01L 29/43* (2006.01)

(52) U.S. Cl.
USPC ....... 257/4; 257/2; 438/95; 365/148; 365/163

(58) Field of Classification Search
USPC .......... 257/2–5, E47.001; 438/95; 365/148, 365/163
See application file for complete search history.

(56) References Cited

U.S. PATENT DOCUMENTS

| | | | |
|---|---|---|---|
| 4,845,533 A | 7/1989 | Pryor et al. | |
| 5,920,122 A * | 7/1999 | Matsumoto et al. | 257/764 |
| 7,332,735 B2 | 2/2008 | Campbell | |
| 7,804,083 B2 | 9/2010 | Chen | |
| 8,237,146 B2 | 8/2012 | Kreupl et al. | |
| 8,263,455 B2 | 9/2012 | Park et al. | |
| 2004/0037179 A1 | 2/2004 | Lee | |
| 2005/0023581 A1 * | 2/2005 | Nuetzel et al. | 257/295 |
| 2006/0237756 A1 * | 10/2006 | Park et al. | 257/296 |
| 2006/0246712 A1 * | 11/2006 | Kim et al. | 438/622 |
| 2006/0255328 A1 * | 11/2006 | Dennison | 257/4 |
| 2007/0158698 A1 * | 7/2007 | Dennison et al. | 257/246 |
| 2007/0210296 A1 * | 9/2007 | Cote et al. | 257/2 |
| 2008/0102560 A1 * | 5/2008 | Hamamjy et al. | 438/102 |
| 2008/0121862 A1 * | 5/2008 | Liu | 257/4 |
| 2008/0137262 A1 * | 6/2008 | Mahalingam et al. | 361/301.4 |
| 2008/0142984 A1 * | 6/2008 | Chen | 257/773 |
| 2009/0014705 A1 | 1/2009 | Hsu et al. | |
| 2009/0050872 A1 * | 2/2009 | Kuo et al. | 257/3 |
| 2009/0122588 A1 * | 5/2009 | Chen | 365/52 |
| 2009/0194758 A1 * | 8/2009 | Chen | 257/4 |
| 2009/0218557 A1 * | 9/2009 | Sato | 257/3 |
| 2009/0246952 A1 | 10/2009 | Ishizaka et al. | |
| 2010/0032638 A1 | 2/2010 | Xu | |
| 2012/0224413 A1 | 9/2012 | Zhang et al. | |

FOREIGN PATENT DOCUMENTS

WO WO-2013/039496 A1 3/2013

OTHER PUBLICATIONS

Int'l Search Report for PCT/US2011/051000 dated Mar. 21, 2013.

* cited by examiner

*Primary Examiner* — Fernando L Toledo
*Assistant Examiner* — Peter Bradford
(74) *Attorney, Agent, or Firm* — Dorsey & Whitney LPP

(57) ABSTRACT

Erosion of chalcogenides in phase change memories using ovonic threshold switch selectors can be reduced by controlling columnar morphology in electrodes used in the ovonic threshold switch. The columnar morphology may cause cracks to occur which allow etchants used to etch the ovonic threshold switch to sneak through the ovonic threshold switch and to attack chalcogenides, either in the switch or in the memory element. In one embodiment, the electrode may be split into two metal nitride layers separated by an intervening metal layer.

12 Claims, 1 Drawing Sheet

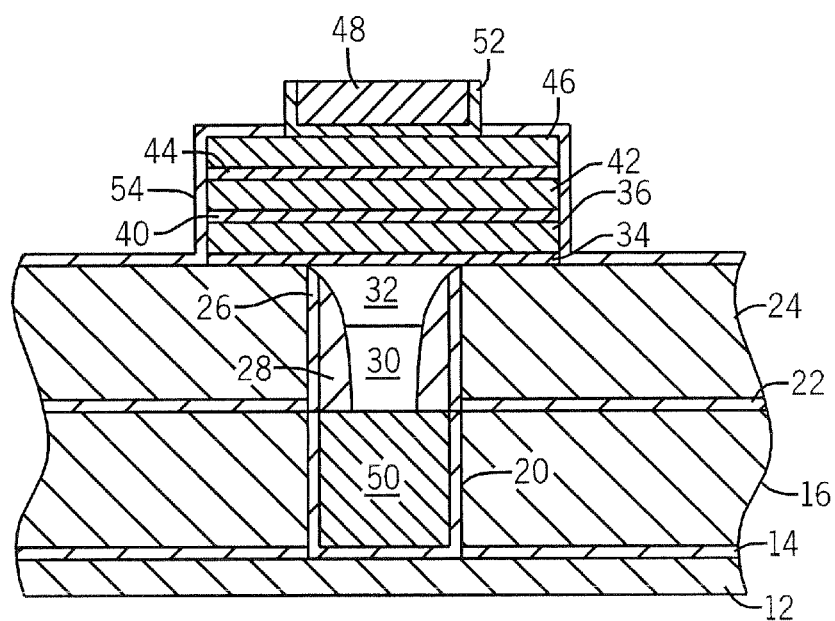

PHASE CHANGE MEMORY INCLUDING OVONIC THRESHOLD SWITCH WITH LAYERED ELECTRODE AND METHODS FOR FORMING SAME

BACKGROUND

This relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF DESCRIPTION OF THE DRAWINGS

FIG. 1 is an enlarged, cross-sectional view of one embodiment of the present invention.

DETAILED DESCRIPTION

In accordance with some embodiments, erosion of chalcogenide during the etching of overlying stacks may be reduced through appropriate design of overlying electrode layers. Particularly, electrodes used in connection with overlying ovonic threshold switches may be prone to the formation of cracks. It is believed, without being limited by theory, that these cracks are the result of columnar morphology of metal nitride electrodes.

The columnar structures in metal nitride electrode film may be grains or grain-like nanostructures. Thus, the cracks may be formed at grain or grain-like nanostructure boundaries. The grain-like nanostructures may be crystallites, for example.

The columnar morphology results in vertical cracks which may allow etchant materials to sneak through these cracks and to etch out underlying chalcogenide material which may be highly susceptible to the etchants used to etch overlying stacks of materials.

Undesired erosion of chalcogenides may be reduced by reducing the thickness of the overlying metal nitride electrodes. Reducing their thickness reduces their tendency to form columnar morphology. In some embodiments, the electrode may be split into two separate sub-layers, for example, separated by an intervening layer of a different material. The layer of a different material may also interfere with the formation of columnar morphology. In addition, even if the constituent sub-layers form cracks, it is unlikely that the cracks would line up sufficiently to allow etchant penetration through both sub-layers.

Particularly, if a relatively thin layer of metal is applied between the two sub-layers of metal nitride, the columnar morphology may be disrupted and, if not, the formation of cracks completely through both sub-layers is unlikely. Thus, as an example, when a metal nitride is used for the electrode, that same metal may be used as the intervening layer, providing the desired disruption of the columnar morphology or penetrating cracks and good adherence to the nitride in some embodiments.

Thus, referring to FIG. 1, a phase change memory cell, in accordance with one embodiment, may include a phase change memory element in series with an overlying ovonic threshold switch that functions as a select device. A phase change memory may include an array of cells coupled by row lines and bitlines.

A first address line 12 at the bottom may extend from left to right. A second address line 48 at the top may extend into the page perpendicularly to the first address line 12. One address line may be a row line and the other address line may be a perpendicularly oriented bitline.

Above the lower address line 12 may be a heater 50 which, in one embodiment, may be titanium silicon nitride. The heater 50 may be isolated using tantalum nitride barrier layer 20. The heater 50 may be encased within a pore formed of two layers of distinct dielectrics 14 and 16. For example, the layer 14 may be nitride and the layer 16 may be oxide.

Similarly, another pore above the heater may be filled with additional heater material 30 and a chalcogenide material 32. That pore may be defined by two different dielectric layers 22 and 24. For example, the lower dielectric layer 22 may be nitride and the upper dielectric layer 24 may be oxide. Likewise, sidewall spacers may reduce the size of the pore. For example, an outer sidewall spacer 26 may enclose an inner sidewall spacer 28. The outer sidewall spacer 26 may, for example, be oxide and the inner sidewall spacer 28 may, for example, be nitride.

Above this structure may be an ovonic threshold switch, in one embodiment. The ovonic threshold switch may include a first electrode 34 which, in one embodiment, may be titanium aluminum nitride. The next layer 36 may include a chalcogenide that forms the ovonic threshold switch. This is followed by a layer 40 which, in one embodiment, may be carbon. A layer 42 may be an electrode layer formed of a metal nitride, such as titanium nitride. A second electrode layer 46 may be formed above the first electrode layer 42, separated by an intervening conductor 44. In some embodiments, the electrode layers 42 and 46 may be formed of a conductive material other than a metal nitride, including a metal without nitride.

The conductor 44 may be formed of the same metal used to form the metal nitride of the layers 42 and 46 in some embodiments. Generally, the layers 42 and 46 may be of the same material, but this is not necessarily so. The intervening conductor 44 may serve, in some embodiments, to break up the columnar structure of the metal nitride layers 42 and 46 by disrupting columns that would otherwise form across the layers 42 and 46 and by enabling reduced thicknesses of those layers. The upper layer 46 may be masked and the entire stack etched using suitable etchants. As a result, the edges of the layers 34, 36, 40, 42, 44, and 46 are aligned. The stack of aligned layers may be covered by a sealing layer 54 in some embodiments.

The erosion of chalcogenide in the layers 32 and/or 36, through cracks formed due to the columnar morphology, may be reduced by reducing the thickness of the layers 42 and 46 by breaking them into two layers and by providing the intervening conductor 44 that is of a different material than the material used for the layers 42 and 46, in some embodiments.

In some embodiments, the thicknesses of the layers 42 and 46 may be less than 350 Angstroms. The intervening conductor 44 may be from 20 to 100 Angstroms thick in some embodiments. In one embodiment, the conductor 44 is about 50 Angstroms thick. It is desirable that the intervening layer be relatively thin, in some embodiments, to reduce the formation of columnar morphology in that layer as well.

In some embodiments, the upper address line 48 may be isolated using a tantalum nitride layer 52, particularly when the upper address line 48 is formed of a copper material. Copper may migrate down through the chalcogenides 32 and/or 36 causing damage. Damage from the lower address line 12 may be reduced in cases where the lower address line 12 is copper by encasing the heater 50 in a tantalum nitride or other barrier layer 20.

The columnar morphology referred to herein may loosely be the result of columnar shaped grains that may be formed within the metal nitride structure. These columnar grains may be vertically oriented, providing vertical paths down through the metal nitride. These paths may be referred to as cracks. As a result, etchants may penetrate through these cracks and travel downwardly all the way down to the chalcogenide. The chalcogenide may be eroded during the etching of the overlying stack used to form the ovonic threshold switch.

More than two metal nitride layers with more than one separating metal layer may be used in some embodiments.

Using the same metal for the layer 44 as is used for the layers 42 and 46 may be advantageous in some cases. It enables all three layers to be formed in the same deposition chamber. It allows the same targets to be used in some cases. And, in some cases, the conductor 44 may adhere better to its own metal nitrides than would other metals. However, different metals may be used in the layers 42, 44, and 46 in some embodiments.

Programming to alter the state or phase of the material may be accomplished by applying voltage potentials to the address lines 12 and 48, thereby generating a voltage potential across a memory element including a phase change material 32. When the voltage potential is greater than the threshold voltages of any select device and memory element, then an electrical current may flow through the phase change material 32 in response to the applied voltage potentials, and may result in heating of the phase change material 32.

This heating may alter the memory state or phase of the material 32, in one embodiment. Altering the phase or state of the material 32 may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

The ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistance state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material 36 that is a chalcogenide alloy. The switch material may be a material in a substantial amorphous state positioned between two electrodes that may be repeatedly and reversibly switched between a higher resistance off state that is generally greater than about 1 megaOhms and a relatively lower resistance on state that is generally less than about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a phase programmable material and, as a result, the switch may not be a memory device capable of storing information. For example, the switching material may remain permanently amorphous and the IV characteristics may remain the same throughout the operating life.

In the low voltage, low electric field mode, where the voltage applied across the switch is less than the threshold voltage $V_{th}$, the switch may be off or non-conducting and exhibits a relatively high resistance. The switch may remain in the off state until a sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

In some embodiments, only one switch may be used. In other embodiments, two or more series connected switches may be used.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
    a phase change memory element including a phase memory material in contact with a first heater having a first cross-sectional area, the first heater adjacent to a second heater having a second cross-sectional area different than the first cross-sectional area such that a ledge is defined between a perimeter of the first heater and a perimeter of the second heater at an interface of the first and second heaters, and wherein the first heater has a third cross-sectional area different than the first and second cross-sectional areas; and
    an ovonic threshold switch over the phase change memory element, the ovonic threshold switch including:
    a first electrode over the phase memory material;
    a chalcogenide layer in contact with the first electrode;
    a carbon layer overlaying the chalcogenide layer; and
    a second electrode over the carbon layer, the second electrode including at least two metal nitride layers separated by an intervening metal layer.

2. The memory of claim 1, wherein the at least two metal nitride layers include Titanium Nitride.

3. The memory of claim 2, wherein the intervening metal layer is formed substantially of the same metal used in the at least two metal nitride layers.

4. The memory of claim 3, wherein edges of the first electrode, the second electrode, and the chalcogenide layer are aligned.

5. The memory of claim 1, wherein the intervening metal layer is from 20 to 100 Angstroms thick.

6. The memory of claim 1, wherein each of the least two metal nitride layers is less than about 350 Angstroms thick.

7. The memory of claim 1, wherein the phase memory material is a chalcogenide material.

8. The memory of claim 1, wherein the first electrode includes a plurality of conductive layers separated by an intervening conducive layers of a different material.

9. The memory of claim 1 further comprising an address line below the second heater and wherein the second heater is isolated from the address line using a barrier layer.

10. The memory of claim 1, wherein the first heater is provided in a first pore and the second heater is provided in a second pore, the first pore comprising a spacer disposed around the first heater.

11. The memory of claim 10, wherein the spacer includes two different dielectric layers.

12. The memory of claim 1, wherein the third cross-sectional area of the first heater is the same as a cross-sectional area of the phase memory material at an interface of the first heater and the phase memory material.

* * * * *